(12) United States Patent
Ishikawa et al.

(10) Patent No.: US 11,396,164 B2
(45) Date of Patent: Jul. 26, 2022

(54) ELECTRONIC COMPONENT AND METHOD OF MANUFACTURING ELECTRONIC COMPONENT

(71) Applicant: MITSUBISHI MATERIALS CORPORATION, Tokyo (JP)

(72) Inventors: Masayuki Ishikawa, Tokyo (JP); Satoru Daido, Sanda (JP); Kaoru Nishizawa, Chichibu-gun (JP); Akihiro Yoshida, Chichibu-gun (JP); Hiroki Sato, Chichibu-gun (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 17/264,004

(22) PCT Filed: Aug. 9, 2019

(86) PCT No.: PCT/JP2019/031746
§ 371 (c)(1),
(2) Date: Jan. 28, 2021

(87) PCT Pub. No.: WO2020/039989
PCT Pub. Date: Feb. 27, 2020

(65) Prior Publication Data
US 2021/0260853 A1      Aug. 26, 2021

(30) Foreign Application Priority Data
Aug. 21, 2018   (JP) ............................. JP2018-154404

(51) Int. Cl.
*H01C 7/04*     (2006.01)
*H01C 1/01*     (2006.01)
(Continued)

(52) U.S. Cl.
CPC ............ *B32B 18/00* (2013.01); *B32B 17/061* (2013.01); *B32B 2250/40* (2013.01);
(Continued)

(58) Field of Classification Search
CPC . B32B 2311/04; B32B 2311/16; B32B 18/00; B32B 17/061; B32B 2457/00;
(Continued)

(56) References Cited

U.S. PATENT DOCUMENTS

2002/0046876 A1* 4/2002 Oshita .................. H01G 2/12
                                                                174/138 R
2002/0075127 A1  6/2002 Inoue et al.
(Continued)

FOREIGN PATENT DOCUMENTS

CN    107871607 A    4/2018
JP    H06-77004 A    3/1994
(Continued)

OTHER PUBLICATIONS

"Why Gold-Tin is the Best Solder Alloy", PTI Blog, Powell Janine, Nov. 22, 2016 (Powell), https://www.palomartechnologies.com/blog/why-gold-tin-is-the-best-solder-alloy (Year: 2016).*
(Continued)

*Primary Examiner* — Daniel J. Schleis
*Assistant Examiner* — Kevin Ct Li
(74) *Attorney, Agent, or Firm* — Locke Lord LLP

(57) ABSTRACT

An electronic component includes a ceramic element, glass-containing Au layers formed on both surfaces of the ceramic element, and an Au—Sn alloy layer formed on at least one of the glass-containing Au layers; the electronic component further includes a pure-Au layer between the glass-containing Au layer and the Au—Sn alloy layer; furthermore, the Au—Sn alloy layer has an Au—Sn eutectic structure.

5 Claims, 3 Drawing Sheets

(51) Int. Cl.
*H01C 17/00* (2006.01)
*H01C 7/02* (2006.01)
*H01F 27/06* (2006.01)
*H01G 2/06* (2006.01)
*H01G 13/00* (2013.01)
*H05K 3/34* (2006.01)
*B32B 18/00* (2006.01)
*B32B 17/06* (2006.01)

(52) U.S. Cl.
CPC ... *B32B 2255/205* (2013.01); *B32B 2307/202* (2013.01); *B32B 2309/02* (2013.01); *B32B 2311/04* (2013.01); *B32B 2311/16* (2013.01); *B32B 2315/02* (2013.01); *B32B 2315/08* (2013.01); *B32B 2457/00* (2013.01)

(58) Field of Classification Search
CPC .......... B32B 2315/08; B32B 2255/205; B32B 2307/202; B32B 2250/40; B32B 2315/02; B32B 2309/02
See application file for complete search history.

(56) References Cited

U.S. PATENT DOCUMENTS

| | | |
|---|---|---|
| 2010/0042112 A1 | 2/2010 | Qureshi et al. |
| 2011/0133217 A1 | 6/2011 | Hakamata et al. |
| 2016/0212850 A1* | 7/2016 | Kainuma .............. H01G 4/232 |
| 2018/0090271 A1 | 3/2018 | Ito et al. |

FOREIGN PATENT DOCUMENTS

| | | | |
|---|---|---|---|
| JP | H10-261507 A | | 9/1998 |
| JP | 2002-83737 A | | 3/2002 |
| JP | 2008-10545 A | | 1/2008 |
| JP | 2011-119436 A | | 6/2011 |
| JP | 2014-54563 A | | 3/2014 |
| JP | 2014-54653 A | | 3/2014 |
| JP | 2014054653 A | * | 3/2014 |
| JP | 2016-136614 A | | 7/2016 |

OTHER PUBLICATIONS

"Ag, Pd/Ag, and Au Thick Films Growth using Screen Printing Method for Microstrip Band Pass Filter Application", RSM2015 Proc. K Terengganu, Malaysia, Utari et al., 2015 (Utari) (Year: 2015).*

International Search Report dated Oct. 29, 2019, issued for PCT/JP2019/031746.

Office Action dated Jun. 25, 2021, issued for Chinese Patent Application No. 201980054623.8.

* cited by examiner

ELECTRONIC COMPONENT AND METHOD OF MANUFACTURING ELECTRONIC COMPONENT

BACKGROUND OF THE INVENTION

Technical Field

The present invention relates to an electronic component such as a thermistor and a capacitor and a method of manufacturing an electronic component. Priority is claimed on Japanese Patent Application No. 2018-154404, filed Aug. 21, 2018, the content of which is incorporated herein by reference.

Background Art

Conventionally, electronic components such as a thermistor and a capacitor in which a metal film (a metal layer) is formed on both surfaces of a ceramic element is known. For example, in a positive characteristic thermistor device disclosed in Patent Document 1, a moisture-proof aluminum electrode is formed as the above-mentioned metal layer on a surface of a PTC thermistor element (semiconductor). As a method of forming such a metal layer of the electronic component, it is described to apply aluminum paste containing glass frit and bake it (refer to Patent Document 1).

Such an electronic component is bonded to a bonding object such as substrate board using an Au—Sn sheet-shape preform. For example, Patent Document 2 describes that an electronic component and a bonding object are joined by heating an Au—Sn sheet-shape preform to melt after placing the bonding object on the Au—Sn sheet-shape preform sucked on a surface of the electronic component by vacuum-sucking from a suction port formed on the surface of the electronic component while blowing a non-acidic gas on the surface side of the electronic component.

A technique is known that various metallized layers are formed on an element such as an LED by a spattering method, a vapor deposition method, a plating method or the like, Au—Sn paste is printed on an Au metallized layer on the outermost surface, and heat treatment (reflow treatment) is carried out to form an Au—Sn alloy layer.

For example, Patent Document 3 describes that a bonding surface of an element is upward and Au—Sn alloy solder paste is applied on it; reflow treatment is carried out in non-oxidation atmosphere to melt the Au—Sn alloy solder paste; a melted Au—Sn alloy solder layer spread on whole surface of the bonding surface of the element is cooled and solidified to form a solidified Au—Sn alloy solder layer; the element having the solidified Au—Sn alloy solder layer is turned over and the element is placed on a substrate board so that the solidified Au—Sn alloy solder layer is in contact with the substrate board; and in this state, reflow treatment is carried out to join the element to the substrate board intervening an Au—Sn alloy solder bonding part no void.

For example, Patent Document 4 describes that Au—Sn containing alloy paste in which Au—Sn alloy powder containing Sn: 20 to 25% by weight and the remainder having a composition made of Au and a particle diameter: 10 μm or less and RA flux of 15 to 30% by weight are mixed is screen-printed on a prescribed region on a metallize layer of Au; then the Au—Sn alloy powder is heated and melted and then solidified, so that an Au—Sn alloy thin film having a thickness of 5 μm or less and at least eutectic structure is formed.

CITATION LIST

Patent Document 1: Japanese Unexamined Patent Application, First Publication No. H06-77004
Patent Document 2: Japanese Unexamined Patent Application, First Publication No. 2011-119436
Patent Document 3: Japanese Unexamined Patent Application, First Publication No. 2008-10545
Patent Document 4: Japanese Unexamined Patent Application, First Publication No. 2014-54563

SUMMARY OF INVENTION

Technical Problem

However, the techniques described in Patent Document 3 and Patent Document 4 take time and effort and increase the cost. The Au—Sn sheet described in Patent Document 2 is hard and brittle material, so that it takes time and effort to make the preform into various shapes. Since the Au—Sn sheet-shape preform is thin and small, it is difficult to position it between the electronic component and the bonding object such as the substrate board, and the positioning work is complex.

Accordingly, electronic components which can be easily joined to a bonding object are desired.

The present invention is achieved in consideration of the above circumstances, and has an object to provide an electronic component which can be easily joined to a bonding object and a method of manufacturing the electronic component.

Solution to Problem

An electronic component of the present invention is provided with a ceramic element, glass-containing Au layers formed on both surfaces of the ceramic element, and an Au—Sn alloy layer formed on at least one of the glass-containing Au layers.

In the electronic component of the present invention, since the Au—Sn alloy layer is formed on at least one of the glass-containing Au layers formed on both surfaces of the ceramic element, it is easy to join the electronic component to a bonding object only by heating in a state in which the Au—Sn alloy layer is in contact with the bonding object (a substrate board or the like). Moreover, since it is not necessary to position the sheet-shape preform precisely between the electronic component and the bonding object, it is possible to simplify the bonding work of the electronic component and the bonding object.

As a preferable aspect of the electrode component of the present invention, it is preferable that a pure-Au layer be provided between the glass-containing Au layers and the Au—Sn alloy layer.

In a case in which the Au—Sn alloy layer is formed directly on the glass-containing Au layers, the glass exposed to the surface of the glass-containing Au layer repels Au—Sn, so glass or unevenness may appear on the surface of the Au—Sn alloy layer. The adhesion to the bonding object may weakened by the part where the glass is exposed and the uneven part, and there is a possibility of deteriorating the bonding strength of the electronic component and the bonding object and thermal conductivity of the electronic component and the bonding object.

By contrast, in the above-described aspect, the pure-Au layer formed between the Au—Sn alloy layer and the glass-containing Au layer covers a whole surface of the glass-containing Au layer including the exposed glass; accordingly, the unevenness is not formed on the surface of the Au—Sn alloy layer formed on it or the glass does not exposed, so that the electronic component can be reliably joined to the bonding object. Accordingly, it is possible to prevent the adhesion strength to the bonding object and the thermal conductivity to the bonding object from deterioration.

As a preferable aspect of the electronic component of the present invention, the Au—Sn alloy layer is preferable to have eutectic structure of Au and Sn.

In the above-described aspect, the Au—Sn alloy layer has the eutectic structure of Au and Sn generated by melted and the solidified; that is, the Au—Sn alloy layer is in the state of solidified after melted, so that it is possible to improve meltability when the electronic component and the bonding object are joined by heated again and melted.

A method of manufacturing an electronic component of the present invention has a glass-containing Au layers forming step to form glass-containing Au layers on both surfaces of a ceramic element and an alloy layer forming step to form an Au—Sn alloy layer on at least one of the glass-containing Au layers formed by the glass-containing Au layers forming step.

In this invention, it is possible to manufacture an electronic component which can be easily joined to a bonding object by a simple method of forming an Au—Sn alloy layer on at least one of glass-containing Au layers after forming the glass-containing Au layers on both surfaces of a ceramic element.

As a preferable aspect of the method of manufacturing an electronic component of the present invention, it is preferable to further have a pure-Au layers forming step to form pure-Au layers on the glass-containing Au layers before the alloy layer forming step.

In a case in which the Au—Sn alloy layer is formed directly on the glass-containing Au layers, since the glass in the glass-containing layers is not easily wet and repels Au and Sn, the surface of the Au—Sn alloy layer is apt to be uneven. There is a possibility that the bonding strength of the electronic component to the bonding object and the thermal conductivity to the bonding object may be deteriorated since the adhesion to the bonding object may be weak on the part where the glass is exposed and the uneven part on the surface of the glass-containing Au layers.

By forming the pure-Au layer with the excellent wettability to Au and Sn between the Au—Sn alloy layer and the glass-containing Au layers, the unevenness of the surface of the Au—Sn alloy layer can be prevented.

As a preferable aspect of the method of manufacturing an electronic component of the present invention, it is preferable that the Au—Sn alloy layer be formed by vapor depositing Au—Sn alloy on at least one of the glass-containing Au layers in the alloy layer forming step.

In the above-described aspect, the Au—Sn alloy layer is formed by vapor depositing Au—Sn alloy, the thickness of the Au—Sn alloy layer can be extremely small.

As a preferable aspect of the method of manufacturing an electronic component of the present invention, it is preferable that the Au—Sn alloy layer be formed in the alloy layer forming step, by applying paste for an Au—Sn alloy layer containing Au and Sn on at least one of the glass-containing Au layers, and after heating to melt, then solidifying.

In the above-described aspect, only by changing the thickness of applying the paste for an Au—Sn alloy layer, the thickness of the Au—Sn alloy layer can be freely set; for example, the thickness can be about 4 µm.

Since the paste for an Au—Sn alloy layer is heated and melted, and then solidified (reflowing) to form the eutectic structure, the meltability of the Au—Sn alloy layer can be improved when heated again and melted for bonding the electronic component and the bonding object.

A method of manufacturing an electronic component of the present invention has a glass-containing Au layers forming step of forming glass-containing layers on both surfaces of a ceramic base board (un-divided material) having a size which can be divided into a plurality of ceramic elements, an alloy layer forming step forming an Au—Sn alloy layer on at least one of the glass-containing Au layers formed in the glass-containing Au layers forming step, and a dividing step dividing the ceramic base material into the ceramic elements after the alloy layer forming step.

In the present invention, by dividing into pieces after forming the glass-containing Au layers and the Au—Sn alloy layer, the steps can be even easier than a case in which the layers are respectively formed on the divided ceramic elements, and the forming speed can be improved. Accordingly, the manufacturing cost of the electronic component can be reduced.

Advantageous Effects of Invention

According to the electronic component and the method of manufacturing the electronic component, the electronic component can be easily joined to a bonding object and manufacturing cost of the electronic component can be reduced.

DESCRIPTION OF EMBODIMENTS

An electronic component and a method of manufacturing an electronic component according to the present invention will be explained referring drawings.

[Summary Structure of Electronic Component]

Figure 1:
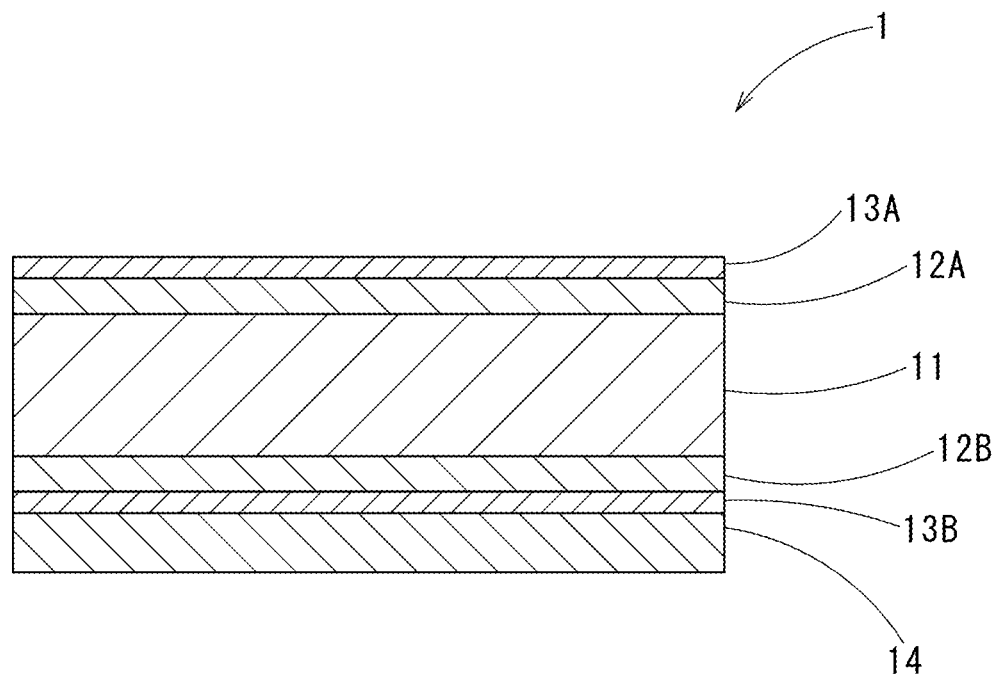
FIG. 1 is a sectional view showing an electronic component according to an embodiment of the present invention.

FIG. 1 is a sectional view showing an electronic component 1 of the present embodiment.

The electronic component 1 used as a thermistor or a capacitor is provided with a ceramic element 11, glass-containing Au layers 12A and 12B formed on both surfaces of the ceramic element 11, pure-Au layers 13A and 13B formed on the glass-containing Au layers 12A and 12B, and an Au—Sn alloy layer 14 formed on the pure-Au layer 13B.

The electronic component 1 is fixed on a bonding object such as a substrate board (not shown). Specifically, the Au—Sn alloy layer 14 of the electronic component 1 is arranged on a bonding surface of the bonding object and heated, and the melted Au—Sn alloy layer 14 is cooled and solidified, so that the electronic component 1 and the bonding object are joined together.

To the pure-Au layer 13A on which the Au—Sn alloy layer 14 is not laminated, though not shown, wirings can be connected by wire bonding or the like.

[Structure of Ceramic Element]

The 11, for example, is a thermistor element such as oxide of one or more metals selected from Mn, Co, Fe, Ni, Cu, Al and the like, formed into a rectangular board shape, and set to have a thickness of 100 µm to 500 µm. For example, in a case in which the ceramic element 11 is a flake (a thin piece shape) thermistor element, it is set to 0.6 mm×0.6 mm in a plan view and a thickness of 150 µm.

[Structure of Glass-Containing Au Layer]

The glass-containing Au layers 12A and 12B is obtained by applying paste in which glass frit (glass powder) and gold powder and the like (hereinafter, it is called glass-containing Au paste) and carrying out heat treatment at 350° C. to 950° C. When the heat treatment is carried out, the glass frit is softened and the gold powder is sintered. The glass-containing Au layers 12A and 12B are made from a sintered body of gold (Au); the glass frit is diffused in the glass-containing Au layers 12A and 12B. The glass-containing Au layers 12A and 12B are set to have a thickness of 1 µm to 20 µm; preferably 4 µm to 15 µm; and more preferably 4 µm to 9 µm.

[Structure of Pure-Au Layer]

It is preferable that the 13A and 13B be formed on the glass-containing Au layers 12A and 12B, i.e., on opposite side surfaces of the glass-containing Au layers 12A and 12B to the ceramic element 11.

The 13A and 13B are made of gold with a purity of 97.00 mass % or more. A thickness of the 13A and 13B is set to, for example, 0.01 µm to 10 µm; preferably 2 µm to 8 µm; more preferably 2 µm to 6 µm. Among the 13A and 13B, on the pure-Au layer 13B, the Au—Sn alloy layer 14 is formed.

In a case in which the Au—Sn alloy layer 14 is directly formed on the glass-containing Au layer 12B, a surface of the Au—Sn alloy layer 14 is tend to be uneven because glass in the glass-containing Au layer 12b repels the melted Au and Sn. Bonding of the bonding object is weakened on a part in which glass is exposed or an uneven part on the surface of the glass-containing Au layer 12B, so that there is a possibility of reducing bonding strength to the bonding object and thermal conductivity of the bonding object.

In the present embodiment, the pure-Au layer 13B is formed between the Au—Sn alloy layer 14 and the glass-containing Au layer 12B, so that the Au—Sn alloy layer 14 is prevented from uneven on the surface.

[Structure of Au—Sn Alloy Layer]

The Au—Sn alloy layer 14 is a bonding layer for joining the electronic component 1 and the bonding object formed by melting and solidifying metal powder in Au—Sn alloy layer paste described later. The Au—Sn alloy layer 14 is formed from the Au—Sn alloy layer paste being applied on the glass-containing Au layer 12B or the pure-Au layer 13B (on the pure-Au layer 13B in this embodiment) and then reflowed (solidified after heated and melted).

In this embodiment, the Au—Sn alloy layer 14 is formed on the pure-Au layer 13B.

The Au—Sn alloy layer 14 has eutectic structure of Au and Sn since it is solidified after being melted by reflow. The Au—Sn alloy layer 14 is set to have a thickness of 3 µm to 30 µm inclusive for example, preferably 5 µm to 25 µm inclusive; more preferably 10 µm to 15 µm inclusive.

[Method of Manufacturing Electronic Component]

Next, a method of manufacturing the electronic component 1 of the present embodiment will be explained.

The method of manufacturing the electronic component 1 has a glass-containing Au layers forming step forming the glass-containing Au layers 12A and 12B on the ceramic element 11, a pure-Au layers forming step forming the 13A and 13B on the glass-containing Au layers 12A and 12B, and an alloy layer forming step forming the Au—Sn alloy layer 14 on the pure-Au layer 13B on the glass-containing Au layer 12B. Although the pure-Au layers forming step is carried out in the present embodiment, the pure-Au layers forming step is not an indispensable step. Below, it will be explained in order of the steps.

[Glass-Containing Au Layers Forming Step]

The glass-containing Au layers forming step consists of a glass-containing Au paste applying step (S11), a drying step (S12), and a sintering step (S13).

(Glass-Containing Au Paste Applying Step)

Figure 3A:
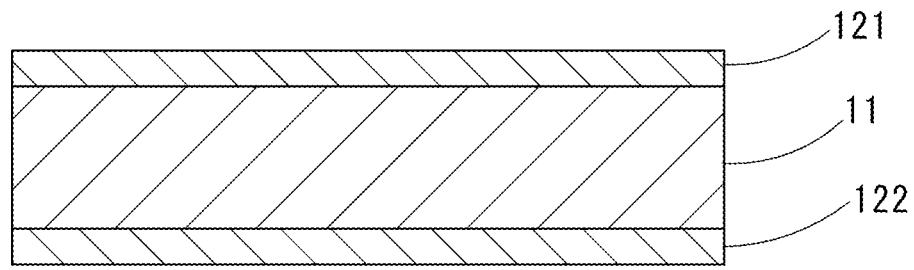
FIG. 3A is a sectional view showing a state in which glass-containing Au paste is applied on both surfaces of a ceramic element in a manufacturing process of the electronic component in the above-mentioned embodiment.

Glass-containing pastes 121 and 122 are applied on both surfaces of the ceramic element 11 as shown in FIG. 3A (S11). When applying the glass-containing Au paste 121 and 122, a screen-printing method or the like can be used. Applying thickness is 1 µm to 25 µm inclusive, preferably 6 µm to 20 µm, more preferably 6 µm to 18 µm.

The glass-containing Au paste 121 and 122 contains gold powder, glass powder (glass frit), the other oxide powder, resin, solvent, dispersant, and plasticizer. In the glass-containing Au paste 121 and 122, the content of powder component formed from the gold powder, the glass powder, and the other oxide powder is 30% by mass to 90% by mass inclusive of the whole glass-containing Au paste; and the balance is the resin, the solvent, the dispersant, and the plasticizer.

A particle diameter of the glass powder is 0.01 µm to 10 µm inclusive, preferably, 1 µm to 10 µm, more preferably 1 µm to 5 µm. The glass powder contains, for example, one or more of lead oxide, zinc oxide, silicon oxide, boron oxide, phosphorus oxide, and bismuth oxide; and has glass transition temperature of 300° C. to 700° C. inclusive, softening temperature of 800° C. or less, and crystallization temperature of 900° C. or higher.

It is appropriate for the solvent to have boiling point of 200° C. or more, particularly organic solvent; for example, diethylene glycol dibutyl ether is preferably used.

The resin adjusts viscosity of the glass-containing Au paste; it is appropriate to be broken down at 200° C. or higher, particularly organic resin is appropriate; ethyl cellulose is preferably used.

In the present embodiment, the dispersant of dicarboxylic acid type is added; however, the glass-containing Au paste may be formed without adding dispersant.

As the other oxide powder, for example, CuO can be used.

As the plasticizer, for example, DOP (dioctyl phthalate), DOS (dioctyl adipate) and the like can be used.

Organic mixture in which mixed powder in which the gold powder, the glass powder and the other oxide powder are mixed, the solvent, and the resin are mixed is premixed with the dispersant and the plasticizer by a mixer to obtain a premixed substance; the premixed substance is kneaded and mixed by a roll mill device to obtain a mixed substance; and then the mixed substance is filtered by a paste filtering device, so that the glass-containing Au paste is made.

(Drying Step)

Next, the glass-containing Au paste 121 and 122 applied on both surfaces of the ceramic element 11 in the glass-containing Au paste applying step is dried (S12).

In the drying step, in order that the solvent gets dry enough, a state in which temperature is 70° C. to 150° C. inclusive, preferably 70° C. to 120° C., more preferably 90° C. to 110° C., is held for 10 minutes to 60 minutes inclusive, preferably 10 minutes to 30 minutes, more preferably 10 minutes to 20 minutes. Drying can be carried out in the air, in vacuum, or inert atmosphere such as $N_2$ and Ar.

(Sintering Step)

After the drying step, heat treatment is performed to sinter the glass-containing Au paste 121 and 122 (S13).

In the sintering step, a state in which temperature is 350° C. to 950° C. inclusive, preferably 350° C. to 850° C., more preferably 750° C. to 850° C. is held for 5 minutes to 120 minutes inclusive, preferably 10 minutes to 120 minutes inclusive, more preferably 10 minutes to 40 minutes. Sintering can be performed in the air, the vacuum, and the inert atmosphere such as $N_2$ and Ar.

By the sintering step S13, the glass-containing Au layers 12A and 12B are formed on both surfaces of the ceramic element 11. In the present embodiment, since the Au paste contains the glass powder, adhesiveness of the glass-containing Au layers 12A and 12B to the ceramic element 11 is good.

[Pure-Au Layers Forming Step (S14)]

The pure-Au layers forming step is carried out when the 13A and 13B are formed on the glass-containing Au layers 12A and 12B, the pure-Au layers forming step (S14) is carried out.

For a forming method of the 13A and 13B, a forming method using Au paste, a vapor deposition method, a spattering method, an electroplating method, an electroless plating method and the like are available. Here, a forming method by the vapor deposition method and a forming method using Au paste will be explained.

(Vapor Deposition Method)

Figure 3B:
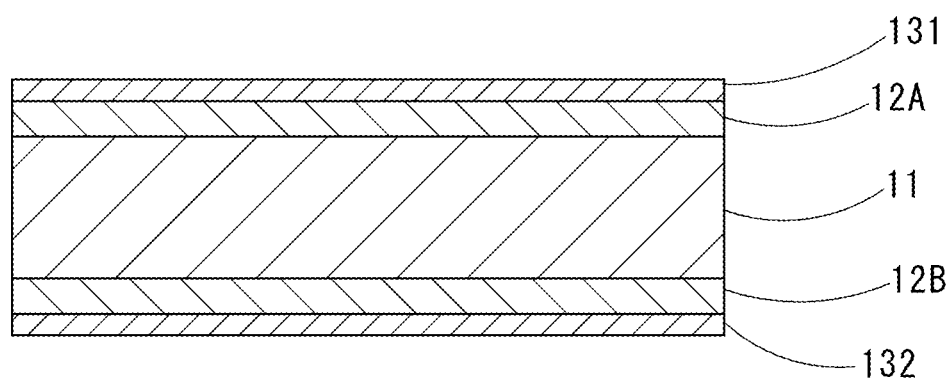
FIG. 3B is a sectional view showing a state in which a pure-Au film is formed on a glass-containing Au layer in the manufacturing process of the electronic component in the above-mentioned embodiment.

As shown in FIG. 3B, pure-Au films 131 and 132 are formed on the surfaces of the glass-containing Au layers 12A and 12B. It is performed to form the pure-Au films 131 and 132 by heating and vaporize pure gold of purity of 99.00% by mass or more in a vacuum vessel to adhere it on the surfaces of the glass-containing Au layers 12A and 12B arranged at a position with a distance and form thin films.

Thereby the 13A and 13B are formed on the glass-containing Au layers 12A and 12B. That is, the pure-Au layer 13B is formed between the glass-containing Au layer 12B and the Au—Sn alloy layer 14.

(Forming Method of Using Au Paste)

Gold paste (hereinafter, called Au paste) is applied on the surfaces of the glass-containing Au layers 12A and 12B and heat treatment is performed at 350° C. to 950° C., so that the gold powder is sintered and the 13A and 13B formed from a gold sintered substance is formed. Au paste is a mixture of gold powder, resin, and solvent. As the gold powder, powder having a particle diameter of 0.6 μm to 10 μm can be used; and the same resin and the same solvent as in those of the above-described glass-containing Au paste can be used. Dispersant and the like may be added as necessary. The content of the gold powder is preferably 50% by mass to 90% by mass in the Au paste.

[Alloy Layer Forming Step]

Figure 2:
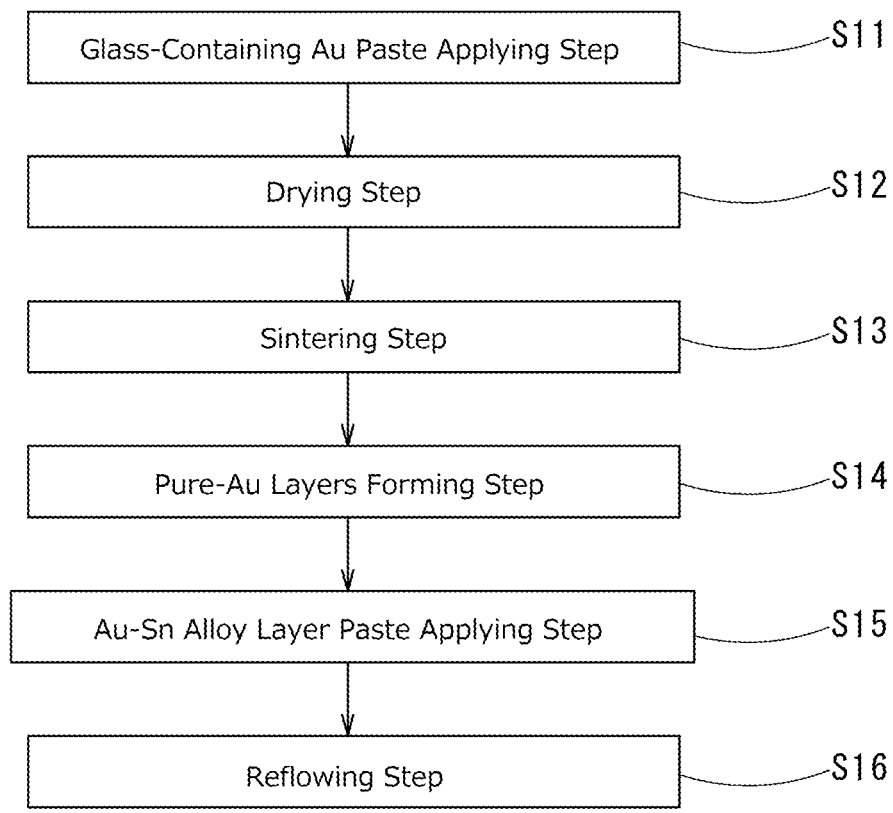
FIG. 2 is a flow chart showing a method of manufacturing the electronic component in the above-mentioned embodiment.

An alloy layer forming step includes an Au—Sn alloy layer paste applying step (S15) and a reflowing step (S16) shown in FIG. 2.

(Au—Sn Alloy Layer Paste Applying Step)

Figure 3C:
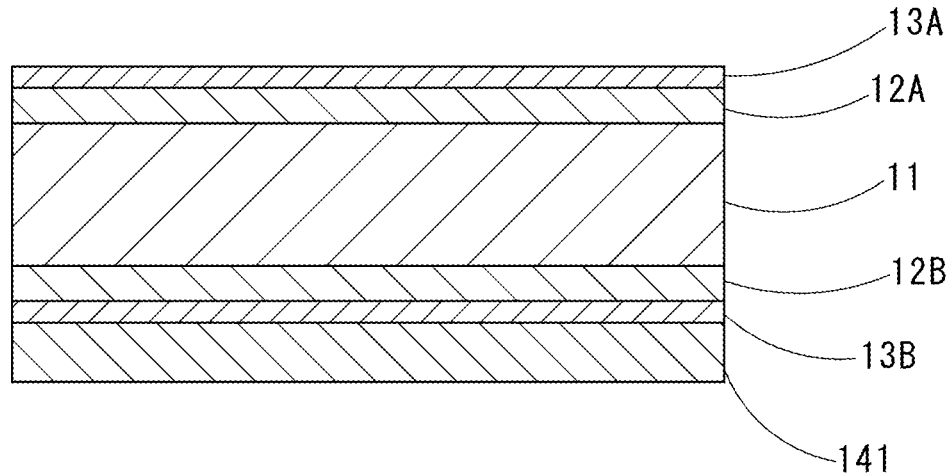
FIG. 3C is a sectional view showing a state in which paste for an Au—Sn alloy layer is applied on the pure-Au layer in the manufacturing process of the electronic component in the above-mentioned embodiment.

On the pure-Au layer 13B, as shown in FIG. 3C, paste 141 for the Au—Sn alloy layer is applied (S15). When applying the paste 141 for Au—Sn alloy layer, a screen-printing method and the like is available. An applying thickness is 1 μm to 25 μm inclusive, preferably 5 μm to 20 μm, more preferably in a range of 10 μm to 15 μm.

The paste 141 for Au—Sn alloy layer is made of metal powder and flux. The metal powder is gold-tin alloy powder, or mixed powder of gold powder and tin powder, or mixed powder of two or more from these three types of powder (the gold-tin alloy powder, the gold powder, and the tin powder). An average particle diameter of the metal powder is set to be, for example, 0.02 μm to 15.0 μm inclusive, preferably 0.2 μm to 15 μm, more preferably 2 μm to 11 μm. The paste 141 for Au—Sn alloy layer contains the gold powder of 80% by mass to 95% by mass and the flux of 5% by mass to 30% by mass, for example. The metal powder preferably has a composition of gold of 21% by mass to 23% by mass and a balance: tin when the metal powder is 100% by mass.

As the flux, for example, general flux (for example, flux containing rosin, active agent, solvent, thickener and the like) can be used. Furthermore, in view of improving the wettability of the Au—Sn alloy layer 14, for example, it is preferable to use mildly-activated flux (RMA) or activated flux (RA).

(Reflowing Step)

Next, the paste 141 for Au—Sn alloy layer applied on the pure-Au layer 13B is heated, melted, and solidified (reflowing) (S16). In the reflowing step, for example by holding at temperature of 290° C. to 330° C. inclusive, preferably 295° C. to 320° C. inclusive, more preferably 300° C. to 310° C. inclusive, for 10 seconds to 180 seconds inclusive, preferably 20 seconds to 90 seconds inclusive, more preferably 30 seconds to 60 seconds inclusive, the paste 141 for Au—Sn alloy layer is melted and the cooled to be solidified. The atmosphere for reflowing is not particularly limited; it can be performed under an inert atmosphere such as a nitrogen atmosphere, an air atmosphere, a reducing atmosphere such as a mix gas of nitrogen and hydrogen.

Thereby the Au—Sn alloy layer 14 is formed on the pure-Au layer 13B (or on the glass-containing Au layer 12B in a case in which the 13A and 13B are not formed).

In the above-described embodiment, since the Au—Sn alloy layer 14 is formed on the glass-containing Au layer 12B among the glass-containing Au layers 12A and 12B in which the electronic component 1 is formed on both surfaces of the ceramic element 11, the electronic component 1 can be easily joined to a bonding object only by heating in a state in which the Au—Sn alloy layer 14 is in contact to the bonding object. Moreover, it is not necessary to precisely locate a sheet-shape preform between the electronic component 1 and the bonding object, so that the bonding work of the electronic component 1 and the bonding object can be simplified.

Since the pure-Au layer 13B is formed between the Au—Sn alloy layer 14 and the glass-containing Au layer 12B, the surface of the Au—Sn alloy layer 14 is not formed uneven, and it can be reliably joined to the bonding object.

Accordingly, it is possible to reduce the deterioration of the bond strength to the bonding object and thermal conductivity to the bonding object.

Furthermore, since the Au—Sn alloy layer 14 has eutectic structure of Au and Sn, i.e., since the Au—Sn alloy layer 14 is in a solidified state after melted, it is possible to improve meltability when it is melted by reheating when the electronic component 1 and the bonding object are joined.

Moreover, only changing the thickness of applying the paste 141 for Au—Sn alloy layer on the glass-containing Au layer 12, so that the thickness of the Au—Sn alloy layer 14 can be freely set.

The present invention is not limited to the above-described embodiment and various modifications may be made without departing from the scope of the present invention.

In the above embodiment, the Au—Sn alloy layer 14 is formed in the alloy layer forming step by applying the paste 141 for Au—Sn alloy layer on the pure Au layer 13B and then reflowing; however, it is not limited to this, for example, it can be formed on an upper surface of the pure Au layer 13B by vapor depositing Au—Sn alloy or plating Au—Sn alloy.

Moreover, in the above-described embodiment, an example in which the glass-containing Au layers 12A and 12B, the 13A and 13B, and the Au—Sn alloy layer 14 are formed on the surfaces of the ceramic element 11 of 0.6 mm square; however, it is not limited to this, the above-described producing method can be applied for a ceramic base material (undivided material) having a size which can be divided into a plurality of semiconductor elements (ceramic elements).

In this case, by carrying out a dividing step in which the ceramic base material is divide into pieces after forming the glass-containing Au layers 12A and 12B and the 13A and the 13B on both surfaces and forming the Au—Sn alloy layer 14 on one surface of the ceramic base material, a large number of the electronic component 1 can be produced at once and the producing cost of the electronic component 1 can be reduced.

Figure 4:
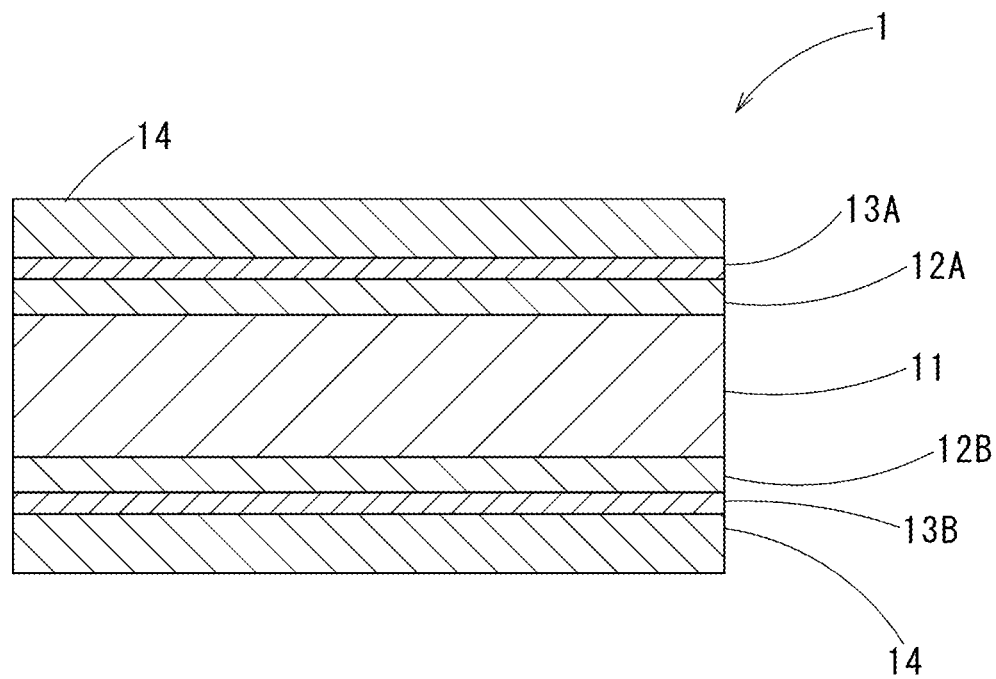
FIG. 4 is a sectional view showing an electronic component in which Au—Sn alloy layers are provided on both surfaces of a ceramic element according to another embodiment of the present invention.

In the above-described embodiment, on both surfaces of the ceramic element 11 the glass-containing Au layers 12A and 12B and the 13A and the 13B are formed and on only one surface the Au—Sn alloy layer 14 is formed; however, it is not limited to this, as shown in FIG. 4, the Au—Sn alloy layer 14 may be formed on each of the glass-containing Au layers 12A and 12B.

Figure 5:
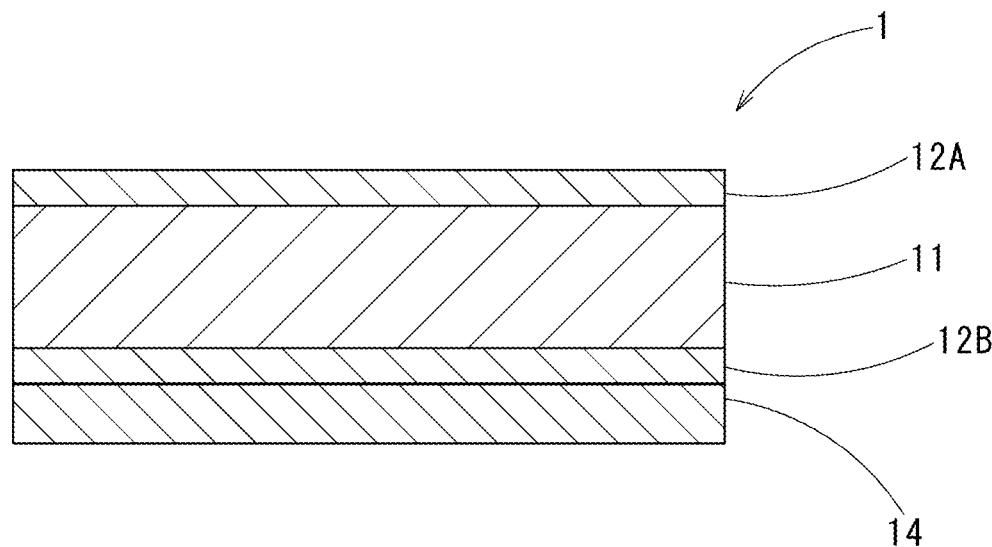
FIG. 5 is a sectional view showing an electronic component in which a pure-Au layer is not provided and an Au—Sn alloy layer is formed directly on a glass-containing Au layer according to another embodiment of the present invention.

Moreover, the Au—Sn alloy layer 14 may be formed directly on the glass-containing Au layer 12B as shown in FIG. 5 without carrying out the pure-Au layers forming step.

In the above-embodiment, the electronic component 1 is explained as a thermistor or a capacitor; however, the field of application of the electronic component 1 is not limited to the thermistor or the capacitor, but can be used for purposes of electric appliances, vessels, mechanical parts and the like.

INDUSTRIAL APPLICABILITY

Electronic components and bonding objects can be easily joined.

REFERENCE SIGNS LIST

1 Electronic component
11 Ceramic element
12A, 12B Glass-containing Au layer
13A, 13B Pure Au layer
14 Au—Sn alloy layer
121, 122 Glass-containing Au paste
131, 132 Pure-Au film
141 Paste for Au—Sn alloy layer

The invention claimed is:

1. An electronic component comprising:
   a rectangular board shape ceramic element having a top surface, a bottom surface and two pairs of sides,
   glass-containing Au layers formed to cover the whole top surface and the whole bottom surface, and
   an Au—Sn alloy layer formed on at least one of the glass-containing Au layers.

2. The electronic component according to claim 1 comprising a pure-Au layer between the glass-containing Au layers and the Au—Sn alloy layer.

3. The electronic component according to claim 1, wherein the Au—Sn alloy layer has a eutectic structure of Au and Sn.

4. The electronic component according to claim 2, wherein the Au—Sn alloy layer has a eutectic structure of Au and Sn.

5. The electronic component according to claim 2, wherein a thickness of the pure-Au layers is 0.01 µm to 10 µm.

* * * * *